United States Patent
Salmela et al.

(10) Patent No.: US 6,847,274 B2
(45) Date of Patent: Jan. 25, 2005

(54) MULTILAYER COAXIAL STRUCTURES AND RESONATOR FORMED THEREFROM

(75) Inventors: Olli Salmela, Helsinki (FI); Ilpo Kokkonen, Oulu (FI)

(73) Assignee: Nokia Corporation, Espoo (FI)

(*) Notice: Subject to any disclaimer, the term of this patent is extended or adjusted under 35 U.S.C. 154(b) by 0 days.

(21) Appl. No.: 10/297,763

(22) PCT Filed: May 17, 2001

(86) PCT No.: PCT/FI01/00482

§ 371 (c)(1),
(2), (4) Date: Dec. 9, 2002

(87) PCT Pub. No.: WO01/95424

PCT Pub. Date: Dec. 13, 2001

(65) Prior Publication Data

US 2003/0151476 A1 Aug. 14, 2003

(30) Foreign Application Priority Data

Jun. 9, 2000 (FI) .......................................... 20001383

(51) Int. Cl.[7] .............................. H01P 7/04; H01P 3/06
(52) U.S. Cl. ....................... 333/222; 333/243; 333/244; 333/238; 333/219
(58) Field of Search ................................ 333/243, 244, 333/245, 238, 219, 222; 257/664

(56) References Cited

U.S. PATENT DOCUMENTS

| | | | |
|---|---|---|---|
| 4,673,904 A | | 6/1987 | Landis ........................ 333/238 |
| 4,845,311 A | * | 7/1989 | Schreiber et al. ......... 333/243 X |
| 5,235,208 A | * | 8/1993 | Katoh ..................... 333/297 X |
| 5,408,053 A | * | 4/1995 | Young ..................... 333/238 X |
| 5,982,256 A | | 11/1999 | Uchimura et al. ............ 333/239 |
| 6,000,120 A | | 12/1999 | Arledge et al. ................ 29/600 |
| 6,465,732 B1 | * | 10/2002 | Dueweke ................ 333/243 X |
| 6,523,252 B1 | * | 2/2003 | Lipponen ...................... 29/828 |
| 6,535,088 B1 | * | 3/2003 | Sherman et al. ............. 333/238 |

FOREIGN PATENT DOCUMENTS

| | | |
|---|---|---|
| EP | 0911903 | 4/1999 |
| WO | 01/95242 | 12/2001 |

\* cited by examiner

*Primary Examiner*—Benny Lee
(74) *Attorney, Agent, or Firm*—Squire, Sanders & Dempsey L.L.P.

(57) ABSTRACT

The idea of the invention is to fabricate a multilayer coaxial transmission line into a printed circuit. The outermost conductor is fabricated by conductive conduit strips in different layers, using conductive via posts in isolation layers connecting the strips. The innermost conductor can be a single conductive strip or multiple strips in different layers connected together through conductive via posts.

23 Claims, 3 Drawing Sheets

US 6,847,274 B2

MULTILAYER COAXIAL STRUCTURES AND RESONATOR FORMED THEREFROM

FIELD OF THE INVENTION

This invention relates to waveguides, transmission lines, and resonators in multilayer printed circuit board structures. In particular the invention concerns a coaxial line structure in printed circuits.

BACKGROUND OF THE INVENTION

Prior art transmission lines used in printed circuits have mainly been microstrips, coplanar waveguides, and striplines. If a coaxial line would have been needed in a circuit board, the coaxial line would have been attached separately to the surrounding circuitry on the surface of the printed circuit. This creates a potential reliability risk due to the increased number of joints, additional electrical loss, and increased temperature related to discontinuity effects. Manufacturing is expensive because of the discrete nature of a coaxial line. Coaxial structures are also relatively large because the dielectric material in the coaxial has a low dielectric constant (;=2–4). Conventional coaxial structures also need space for supporting and protective layers around the cable.

As mentioned above, microstrips, coplanar waveguides, and striplines are the usual structures in multilayer printed circuits as mentioned. These are sensitive to EMC (Electromagnetic compatibility) disturbances, such as electromagnetic interference. Due to the effect of radiation, especially at high frequencies, conventional multilayer transmission lines have high transmission losses as well. Using typical multilayer transmission line structures means that only moderate Q values can be gained, making it difficult to apply multilayer ceramics technologies in high Q value applications, such as resonators.

The objective of the invention is to decrease the above-mentioned drawbacks of known solutions.

SUMMARY OF THE INVENTION

The idea of the invention is to fabricate a multilayer coaxial transmission line into a printed circuit. The outermost conductor is fabricated by conductive conduit strips in different layers, using conductive via posts in isolation layers connecting the strips. The innermost conductor can be a single conductive strip or multiple strips in different layers connected together through conductive via posts. The objective of the invention is achieved in a manner described in the claims.

BRIEF DESCRIPTION OF THE DRAWINGS

In the following the invention is described in more detail by means of the attached figures, of which

DETAILED DESCRIPTION OF THE INVENTION

Figure 1:
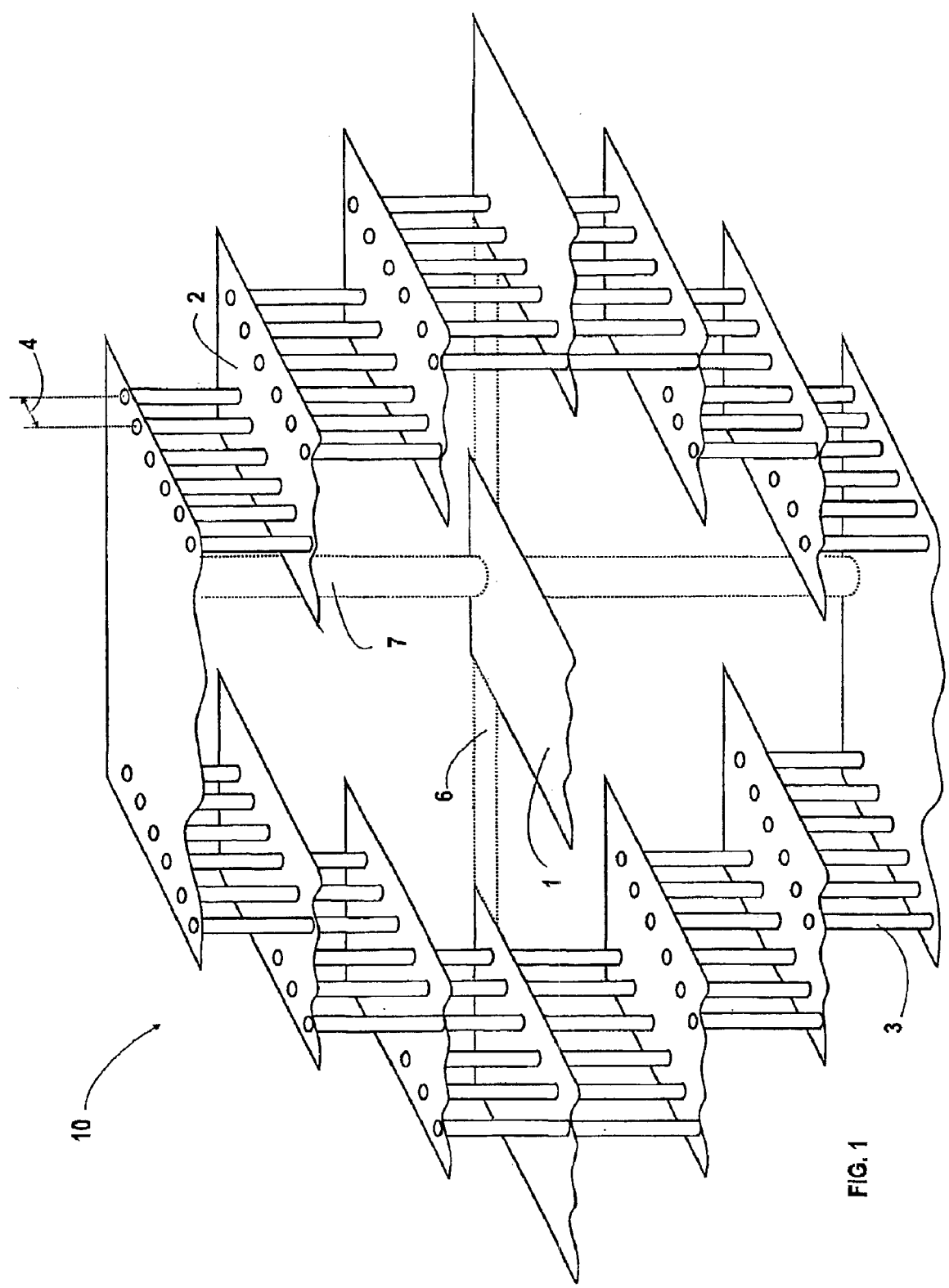
FIG. 1 illustrates an example of a coaxial structure according to the invention.

FIG. 1 depicts an example of the coaxial structure (10) according to the invention. The innermost line strip (1) of the multilayer structure forms a transmission line for a signal, and the outermost line strips (2) in different layers of a circuit board, which are connected by via posts (3) to each other, form a ground conductor. The outermost line strips are arranged to form as round a circle as possible in order to imitate the actual coaxial waveguide. The distance (4) between the via posts should be less than a quarter in wavelength in order to guarantee good isolation between the coaxial structure and the rest of the circuit board. The via post separation (4) must not be more than half a wavelength, since otherwise multiple transmission lines start to behave like coupled resonators, resulting in severe oscillations within the structure. The minimum length between via posts is determined by the mechanical strength of a circuit board structure.

Figure 2:
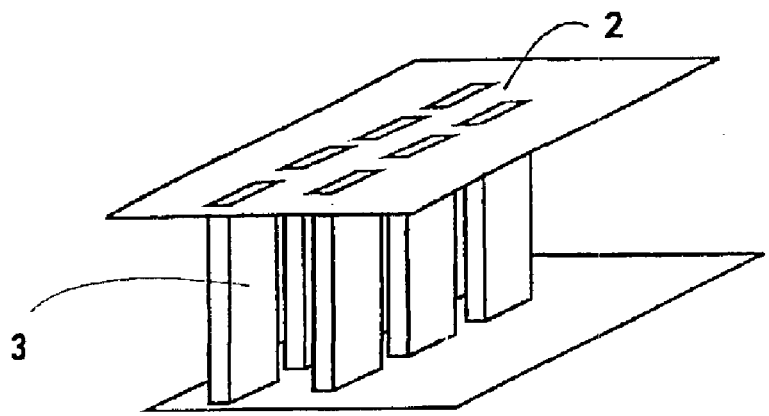
FIG. 2 illustrates an example of a conductive via post structure.

In multilayer ceramics technology, it is easy to form via posts in isolation, which can be filled with conductive paste to form signal paths before the firing process. By using a screen printing process, it is easy to create conductive transmission line strips as well. Via posts need not be round taps, but they can be other shapes too. FIG. 2 illustrates via posts 3 which are rectangles. The post can be placed in more than one row in order to improve isolation.

Figure 3:
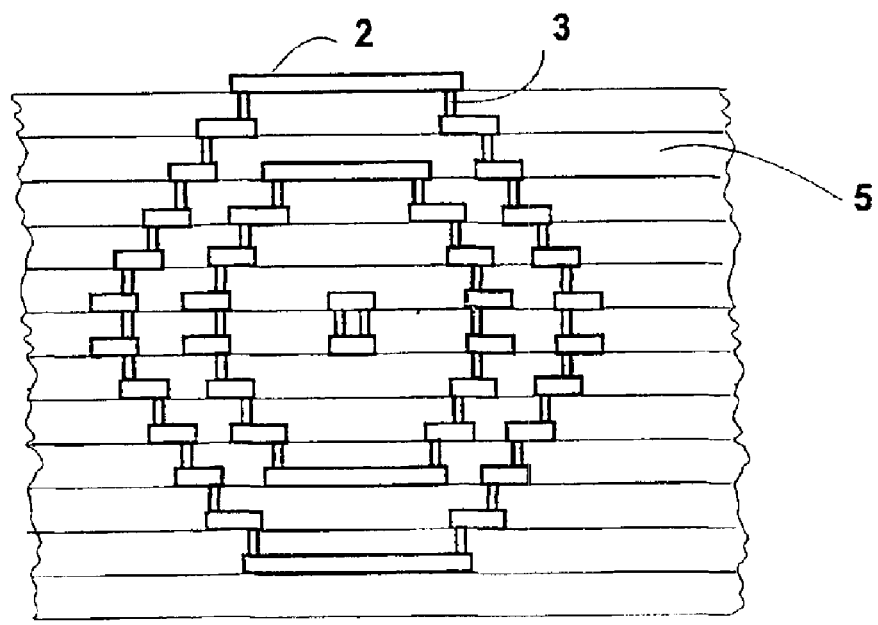
FIG. 3 illustrates an example of a cross-section of a coaxial structure according to the invention.

In FIG. 3 another example of the cross-section of a coaxial structure is depicted according to the invention. Now the signal conductor is composed of two line strips in different layers, which are connected with via posts through isolation area (5). This is to suppress conductor losses. There are also two outermost conductors in this case, i.e. FIG. 3 represents a triaxial structure. The triaxial structure is especially needed, for example, in sensitive measurement devices or if good immunity to EMI (Electromagnetic Interference) disturbances is otherwise required. It is also possible to fabricate more conductors in a coaxial structure if needed, i.e. to form multiaxial structures.

The short-circuit end of a coaxial structure is formed by using conductive strips (6) (see FIG. 1), posts (7), or both, to connect the innermost conductor to the outermost conductor.

Figure 4:
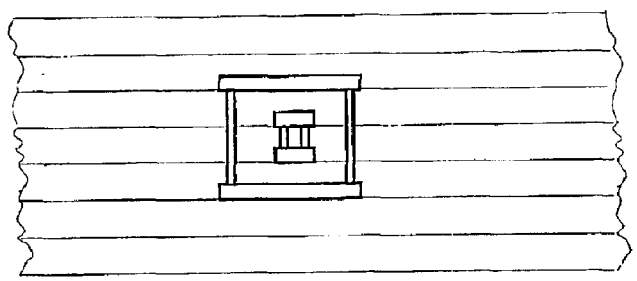
FIG. 4 illustrates another example of a cross-section of a coaxial structure according to the invention.
Figure 5:
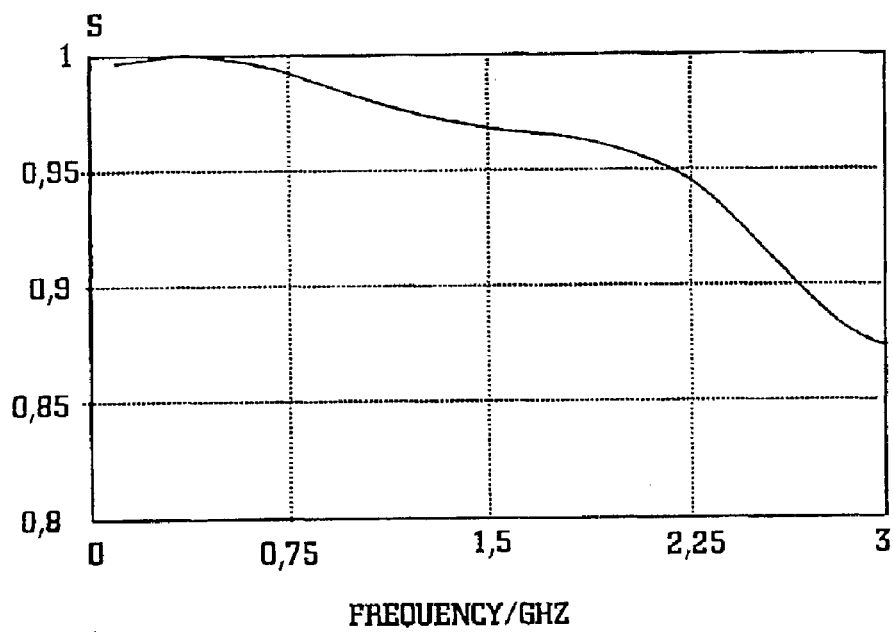
FIG. 5 shows an example of a diagram of a reflection coefficient in a coaxial structure according to FIG. 4.
Figure 6:
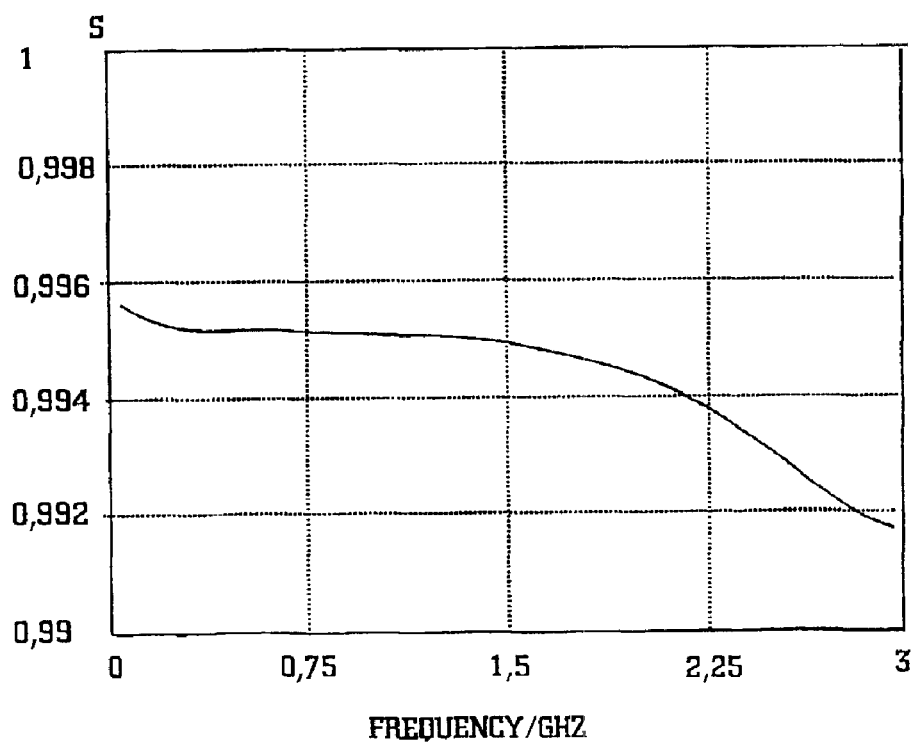
FIG. 6 shows an example of a diagram of a reflection coefficient in a coaxial structure according to FIG. 1.

FIG. 4 shows the cross-section of a coaxial structure where the outermost conductor is in the form of rectangle. The rectangle form is easier to manufacture and more inexpensive than the structure where the outermost conductor is in the form of round. However, losses are greater in the form of rectangle. FIG. 5 shows an example of a reflection coefficient (S) when the test signal is input to the rectangular coaxial line (FIG. 4) whose other end has been supplied with a short-circuit. Correspondingly, FIG. 6 shows an example of a reflection coefficient (S) when the test signal is input to the round coaxial line (FIG. 1) whose the other end has been supplied with a short-circuit. The reflection coefficient is greater in the round coaxial line than in the rectangular coaxial line, i.e. there are more losses in the rectangular coaxial line. Thus it is usually desired to arrange the outermost line strips for forming as round a circle as possible.

Because the multilayer coaxial structure is integrated into a printed circuit, this is an inexpensive solution. There is more space on the surface of the printed circuit for other components. The size of the coaxial structure can be reduced if high dielectric constant material is used. Typically dielectric materials used in coaxial cables have low dielectric constant values (2 ... 4), while in multilayer ceramics dielectric constant values range from 5 up to several hundred.

EMC problems can be avoided since the outermost line of a coaxial line can act as an EMC shield to the surrounding circuitry. This also means low radiation losses. The coaxial structure has inherently a high Q value due to its geometry. High Q value of a multilayer coaxial structure enables the usage of high Q value resonators and filters in multilayer circuit boards.

The coaxial line has a low dispersion since it is of the TEM (Transverse Electric-Magnetic) transmission line type, providing that the use of this kind of transmission line is possible at high frequencies.

The invention could be applied, for example, to either multilayer ceramic technologies, such as LTCC (Low Temperature Cofired Ceramics) and HTCC (High Temperature Cofired Ceramics), or to advanced laminated printed circuit board technology.

Although the invention has been described in the light of the above-mentioned examples, it is evident that the invention is not restricted to them, but that it can be used in other structures within the scope of the inventive idea.

What is claimed is:

1. A resonator comprising:
   a first conductor including a plurality of line strips disposed along a lengthwise direction on different layers of the circuit board, said plurality of line strips being connected by conductive via posts to provide a conductive pipe having a round cross-section,
   a second conductor disposed along the lengthwise direction into a center of the first conductor; and
   conductive elements between the first conductor and the second conductor.

2. The resonator according to claim 1, wherein the second conductor has a cross-sectional structure similar to that of the first conductor.

3. The resonator according to claim 1, wherein the conductive via posts between adjacent pairs of the plurality of line strips of the first conductor are disposed in a row parallel to the plurality of line strips.

4. The resonator according to claim 1, wherein the conductive via posts between adjacent pairs of the plurality of line strips of the first conductor are disposed in several rows parallel to the plurality of line strips.

5. The resonator according to claim 1, wherein the conductive via posts comprise round taps.

6. The resonator according to claim 1, wherein the conductive via posts comprise rectangular taps.

7. The resonator according to claim 1, wherein the second conductor comprises a line strip.

8. A method of manufacturing a coaxial structure, the method comprising the steps of:
   providing a plurality of first line strips arranged in successive layers on a circuit board to form a hollow member by arranging said plurality of first line strips in a shape of a circle;
   connecting the plurality of first line strips to each other by via posts;
   inserting at least one second line strip in a center of the plurality of first line strips; and
   mounting the at least one second line strip to the plurality of first line strips by at least one conductive connecting member.

9. The method according to claim 8, wherein the step of mounting the at least one second line strip to the plurality of first line strips comprises mounting the at least one second line strip by at least one conductive strip.

10. The method according to claim 8, wherein the step of mounting the at least one second line strip to the plurality of first line strips comprises mounting the at least one second line strip by at least one post.

11. The method according to claim 8, wherein the step of mounting the at least one second line strip to the plurality of first line strips comprises mounting the at least one second line strip by a conductive strip and a post.

12. The method according to claim 8, further comprising the step of filling the via posts with a conductive paste to form signal paths.

13. A circuit board transmission line, comprising:
   a first conductor including a plurality of first line strips disposed along a lengthwise direction on different layers of a circuit board, said plurality of first line strips being connected by conductive via posts to provide a conductive pipe having a round cross-section, and
   a second conductor including at least one second line strip disposed along the lengthwise direction into a center of the first conductor; and
   conductive elements connecting the first conductor to the second conductor.

14. The circuit board transmission line according to claim 13, the second conductor comprising a plurality of second line strips in different layers of the circuit board, said plurality of second line strips being connected together by further conductive via posts.

15. The circuit board transmission line according to claim 13, further comprising additional conductors of a same type as the first conductor.

16. The circuit board transmission line according to claim 13, wherein the conductive via posts between the plurality of first line strips in the first conductor are disposed in a row parallel to the plurality of first line strips.

17. The circuit board transmission line according to claim 13, wherein the conductive via posts between the plurality of first line strips in the first conductor are disposed in several rows parallel to the plurality of first line strips.

18. The circuit board transmission line according to claim 13, wherein the conductive via posts comprise round taps.

19. The circuit board transmission line according to claim 13, wherein the conductive via posts comprise rectangular taps.

20. A coaxial structure comprising:
   a plurality of first conducting means for conducting a current arranged in successive layers on a circuit board to provide a hollow member comprising a circular cross section;
   connecting means for connecting the plurality of first conducting means to each other
   second conducting means for conducting a current disposed in a hollow center of the plurality of the first conducting means; and
   conductive mounting means for mounting the second conducting means to the first conducting means.

21. The coaxial structure according to claim 20, wherein the conductive mounting means comprises conductive strips.

22. The coaxial structure according to claim 20, wherein the conductive mounting means comprises at least one conductive strip and at least one conductive post.

23. The coaxial structure according to claim 20, wherein the via posts are filled with conductive paste.

* * * * *